US009732759B2

(12) United States Patent
Chen (10) Patent No.: US 9,732,759 B2
(45) Date of Patent: Aug. 15, 2017

(54) METHOD AND APPARATUS FOR CONTROLLING SUBRACK FANS

(71) Applicant: ZTE Corporation, Shenzhen, Guangdong (CN)

(72) Inventor: Jin Chen, Shenzhen (CN)

(73) Assignee: ZTE CORPORATION, Shenzhen, Guangdong (CN)

(*) Notice: Subject to any disclaimer, the term of this patent is extended or adjusted under 35 U.S.C. 154(b) by 131 days.

(21) Appl. No.: 14/764,173

(22) PCT Filed: Sep. 18, 2013

(86) PCT No.: PCT/CN2013/083829
§ 371 (c)(1),
(2) Date: Jul. 29, 2015

(87) PCT Pub. No.: WO2014/117528
PCT Pub. Date: Aug. 7, 2014

(65) Prior Publication Data
US 2015/0377243 A1    Dec. 31, 2015

(30) Foreign Application Priority Data
Jan. 30, 2013   (CN) .......................... 2013 1 0037431

(51) Int. Cl.
*F04D 27/00*    (2006.01)
*F04D 25/16*    (2006.01)
*H05K 7/20*     (2006.01)

(52) U.S. Cl.
CPC ......... *F04D 27/004* (2013.01); *F04D 25/166* (2013.01); *H05K 7/207* (2013.01); *H05K 7/20563* (2013.01); *H05K 7/20572* (2013.01)

(58) Field of Classification Search
CPC ..... F04D 27/004; F04D 25/166; H05K 7/207; H05K 7/20572; H05K 7/20563
See application file for complete search history.

(56) References Cited

U.S. PATENT DOCUMENTS 6,826,456 B1 * 11/2004 Irving ....................... G06F 1/20
                                                    361/695
7,194,340 B2 * 3/2007 Honma .................. H05K 7/207
                                                    361/695
(Continued)

FOREIGN PATENT DOCUMENTS

AU    2008234969 A1    5/2009
CN       1758170 A     4/2006
(Continued)

OTHER PUBLICATIONS

Supplementary European Search Report in European application No. 13874149.1, mailed on Jan. 22, 2016.
(Continued)

*Primary Examiner* — Ramesh Patel
(74) *Attorney, Agent, or Firm* — Oppedahl Patent Law Firm LLC (57) ABSTRACT

Disclosed are a method and an apparatus for controlling subrack fans. The method comprises: by installing multiple boards installed with high-power components in different areas of a subrack respectively, forming multiple heat dissipation air channels corresponding to the multiple boards respectively; installing a fan group comprising multiple heat dissipation fans on the subrack; dividing the fan group into multiple fan areas corresponding to the multiple heat dissipation air channels respectively, so that each fan area blows air to a corresponding board through a corresponding heat dissipation air channel; detecting temperature of each board and a rotating speed of a corresponding fan area in real time; adjusting the rotating speed of the fan area according to a detection result, so that the rotating speed of the fan area increases or decreases as the temperature of the corresponding board increases or decreases. Also disclosed is the apparatus for controlling subrack fans.

8 Claims, 4 Drawing Sheets

(56) References Cited

U.S. PATENT DOCUMENTS

| | | | | |
|---|---|---|---|---|
| 2006/0203449 A1* | 9/2006 | Honma | ................. | H05K 7/207 |
| | | | | 361/695 |
| 2007/0080653 A1* | 4/2007 | Wei | .................... | H05K 7/20209 |
| | | | | 318/66 |
| 2007/0182608 A1* | 8/2007 | Testin | ................ | G05D 23/1913 |
| | | | | 341/139 |
| 2010/0087965 A1* | 4/2010 | Tunks | .................... | G06F 1/206 |
| | | | | 700/300 |
| 2012/0136502 A1* | 5/2012 | Liu | ...................... | F04D 25/166 |
| | | | | 700/300 |

FOREIGN PATENT DOCUMENTS

| | | | | | |
|---|---|---|---|---|---|
| CN | 1963233 | A | | 5/2007 | |
| CN | 201336787 | Y | | 10/2009 | |
| CN | 101761500 | A | | 6/2010 | |
| CN | 102307447 | A | | 1/2012 | |
| CN | 102767530 | A | * | 11/2012 | ............ F04D 27/00 |
| CN | 103075360 | A | | 5/2013 | |
| EP | 2947329 | A1 | * | 11/2015 | ........... F04D 25/166 |
| JP | 2009027051 | A | | 2/2009 | |

OTHER PUBLICATIONS

International Search Report in international application No. PCT/CN2013/083829, mailed on Dec. 26, 2013.
English Translation of the Written Opinion of the International Search Authority in international application No. PCT/CN2013/083829, mailed on Dec. 26, 2013.

* cited by examiner

METHOD AND APPARATUS FOR CONTROLLING SUBRACK FANS

TECHNICAL FIELD

The disclosure relates to a technology of heat dissipation, and more particularly, to a method and an apparatus for controlling subrack fans.

BACKGROUND

Currently, in the fields of electronics, computers, communication and electrics, a working frequency of an equipment (in particular, a carrier-class data communication equipment) becomes higher and higher, and meanwhile, power consumption and heat of the equipment also are increased more and more. Electronic components (particularly the chip) in the equipment have a strict requirement on temperature, and over-temperature may cause a service abnormity, shortening of service life of the equipment and even direct damage to the equipment. In thermal design, in order to meet a heat dissipation requirement of a system and to improve reliability, the system is usually provided with multiple high-power fans. Nowadays, many systems are provided with tens of and even dozens of fans. Use of multiple fans solves the heat dissipation problem of the systems, but brings new problems. First of all, power consumption of the fans is increased, and heat produced by the fans is also increased, so that heat of the whole system is increased. In addition, too much noise may be produced by the fans of high-speed rotation.

A method for solving power consumption and noise problems of the fans is mainly to control rotating speeds of the fans. Current researches still focus on control over individual fans and design of a fan control circuit. A unified speed regulation method is adopted for controlling multiple fans in a system at present. The problem is that power consumption and heat dissipation conditions at each position in the system are different and dynamically change. In an existing fan control solution, rotating speeds of the fans are regulated according to the highest temperature in the system as a reference, and thus all the fans work at the same rotating speed. Some fans unnecessarily work in a high-speed state, which increases the power consumption and noise of the system and brings adverse impact on the service life of the fans.

SUMMARY

The embodiments of the disclosure are intended to provide a method and an apparatus for controlling subrack fans, which can better reduce power consumption and noise of the fans and accurately display a rotating speed of each fan.

According to an embodiment of the disclosure, a method for controlling subrack fans includes:

forming multiple heat dissipation air channels respectively corresponding to multiple boards by installing the multiple boards with high-power devices in different areas of a subrack;

installing a fan set including multiple heat dissipation fans on the subrack;

dividing the fan set into multiple fan subsets corresponding to the multiple heat dissipation air channels respectively so as to supply air to the corresponding board by each of the multiple fan subsets through the corresponding heat dissipation air channel;

detecting temperature of each board and a rotating speed of the corresponding fan subset in real time; and regulating the rotating speeds of the fan subsets according to detection results to enable the rotating speed of any of the fan subsets to be increased or decreased along with increase or decrease of the temperature of the corresponding board.

In the solution, the step of detecting the temperature of each board in real time includes:

measuring temperatures at temperature measurement points on each board via temperature sensors respectively;

calculating a relative value of the temperature at each temperature measurement point according to the temperature at each temperature measurement point and pre-stored reference temperature at each temperature measurement point; and comparing the relative value of the temperature of each temperature measurement point to obtain a maximum relative value of the temperature at all the temperature measurement points.

In the solution, the step of regulating the rotating speeds of the fan subsets according to the detection results includes:

when the maximum relative value of the temperature at all the temperature measurement points is greater than a first preset threshold, increasing rotating speed of the fans in the fan subset by one level according to current rotating speed of the fans, the increased rotating speed not exceeding a preset maximum fan rotating speed;

when the maximum relative value of the temperature at all the temperature measurement points is lower than a second preset threshold, decreasing the rotating speeds of the fans in the fan subset by one level according to the current rotating speed of the fans, the decreased rotating speed being not lower than a preset minimum fan rotating speed; and when the maximum relative value of the temperature at all the temperature measurement points is between the second threshold and the first threshold, keeping the rotating speed of the fans in the fan subset unchanged.

In the solution, the method further includes:

assigning rotating speed detection signals of each fan of the fan set with a number, and making the number of each rotating speed detection signal consistent with a number of each rotating speed detection slot in a fan control board; and assigning control signal of each fan in the fan set with a number, and making the number of each control signal consistent with the number of each control slot in the fan control board.

In the solution, the method further includes:

arranging the fans of the fan set in a format of matrix, separately installing the control slots for the control lines of the fans and the rotating speed detection slots for the rotating speed detection lines, the control slots of the fans in the same row being formed together, the rotating speed detection slots of the fans in the same column being formed together, and determining a position of each fan in the fan set by a matrix scanning detection method.

In the solution, the step of determining the position of each fan in the fan set by the matrix scanning detection method includes:

for a detected fan, applying a control signal different from those of the other fans to the control slot of the detected fan to make the rotating speed of the detected fan different from those of the other fans;

detecting all the rotating speed detection signals one by one to find a unique rotating speed detection signal to which the rotating speed different from the other rotating speeds corresponds, and recording the number of the unique rotating speed detection signal; and determining the position of the detected fan according to the number of the control slot to which the control signal is applied and the number of the unique rotating speed detection signal.

In the solution, certain gaps are kept between the fan subsets and the heat dissipation air channels, so that the heat dissipation fans of each fan subset supply a small amount of air to the adjacent heat dissipation air channels.

According to an embodiment of the disclosure, an apparatus for controlling subrack fans includes:

a heat dissipation air channel acquisition unit, configured to form multiple heat dissipation air channels corresponding to multiple boards by installing the multiple boards with high-power devices in different areas of a subrack;

a fan set acquisition unit, configured to install a fan set comprising multiple heat dissipation fans on the subrack;

a fan subset division unit, configured to divide the fan set into multiple fan subsets corresponding to the multiple heat dissipation air channels respectively so as to supply air to the corresponding board by each of the multiple fan subsets through the corresponding heat dissipation air channel;

a board temperature and fan subset rotating speed detection unit, configured to detect temperature of each board and a rotating speed of the corresponding fan subset in real time; and a fan subset rotating speed regulation unit, configured to regulate the rotating speeds of the fan subsets according to detection results to enable the rotating speed of any of the fan subsets to be increased or decreased along with increase or decrease of the temperature of the corresponding board.

In the solution, the board temperature and fan subset rotating speed detection unit includes: a board temperature detection module and a rotating speed acquisition module, wherein the board temperature detection module is configured to:

measure temperatures at temperature measurement points on each board via temperature sensors respectively;

calculate a relative value of the temperature at each temperature measurement point according to the temperature at each temperature measurement point and pre-stored reference temperature at each temperature measurement point; and compare the relative value of the temperature at each temperature measurement point to obtain a maximum relative value of the temperature at all the temperature measurement points.

In the solution, the fan subset rotating speed regulation unit is configured to:

when the maximum relative value of the temperature at all the temperature measurement points is greater than a first preset threshold, increase rotating speed of the fans in the fan subset by one level according to current rotating speed of the fans, the increased rotating speed not exceeding a preset maximum fan rotating speed;

when the maximum relative value of the temperature at all the temperature measurement points is lower than a second preset threshold, decrease the rotating speed of the fans in the fan subsets by one level according to the current rotating speed of the fans, the decreased rotating speed being not lower than a preset minimum fan rotating speed; and when the maximum relative value of the temperature at all the temperature measurement points is between the second threshold and the first threshold, keep the rotating speed of the fans in the fan subset unchanged.

Compared with the existing technology, the embodiments of the disclosure have the following benefits.

According to the embodiments of the disclosure, power consumption and noise of the fans can be effectively reduced while ensuring efficient heat dissipation of the system. In addition, the rotating speed of each fan can be accurately displayed.

DETAILED DESCRIPTION

The preferred embodiments of the disclosure are described in detail below with reference to the drawings. It should be understood that the preferred embodiments described below are only used to describe and explain the disclosure and not intended to limit the disclosure.

The embodiments of the disclosure are mainly described with respect to a type of subracks. This type of the subracks is provided with multiple boards (multiple temperature-sensitive electronic chips, such as a Central Processing Unit (CPU), a Field Programmable Gate Array (FPGA) and a network processor, are provided on each board) arranged at different slots. Thus, multiple heat dissipation air channels are formed. Airflow is blown in by a fan set from one side, and flows out from the other side after passing through the heat dissipation fins of the temperature-sensitive electronic chips.

According to a method and an apparatus for controlling fans provided by the embodiments of the disclosure, slot number of control line and slot number of fan rotating speed detection line for each fan are accurately determined by matrix scanning, thereby providing a reliable method for separately controlling the fans and accurately displaying a rotating speed of each fan.

Figure 2:
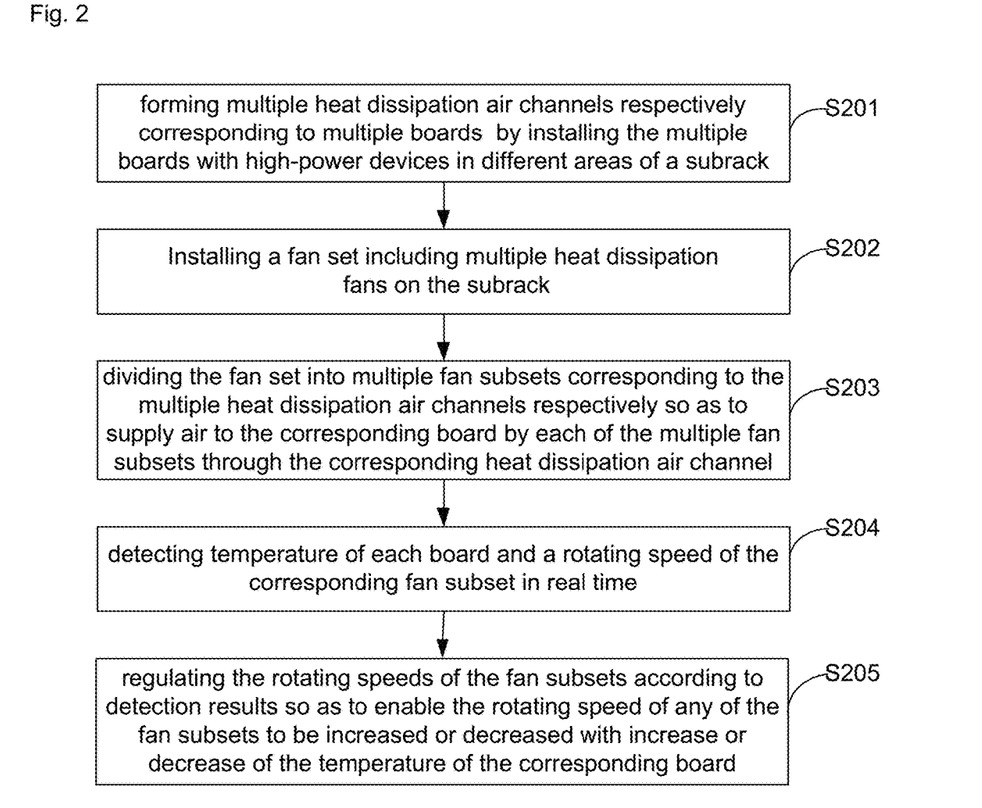
FIG. 2 is a flowchart of a method for controlling subrack fans according to an embodiment of the disclosure.

FIG. 2 is a flowchart of a method for controlling subrack fans according to an embodiment of the disclosure. As shown in FIG. 2, the method includes the following steps.

Step 201: forming multiple heat dissipation air channels respectively corresponding to multiple boards by installing the multiple boards with high-power devices in different areas of a subrack;

Step 202: installing a fan set including multiple heat dissipation fans on the subrack;

Step 203: dividing the fan set into multiple fan subsets corresponding to the multiple heat dissipation air channels respectively so as to supply air to the corresponding board by each of the multiple fan subsets through the corresponding heat dissipation air channel;

Step 204: detecting temperature of each board and a rotating speed of the corresponding fan subset in real time;

Step 205: regulating the rotating speeds of the fan subsets according to detection results so as to enable the rotating speed of any of the fan subsets to be increased or decreased with increase or decrease of the temperature of the corresponding board.

In the embodiment of the disclosure, the step of detecting the temperature of each board in real time includes: measuring temperatures at temperature measurement points on each board via temperature sensors; calculating a temperature relative value at each of temperature measurement points according to the temperature of each of temperature measurement points and pre-stored reference temperature of each of temperature measurement points; and comparing the temperature relative values of all temperature measurement points to obtain a maximum temperature relative value of the temperature measurement point.

In the embodiment of the disclosure, the step of regulating the rotating speeds of the fan subsets according to the detection results includes: when the maximum temperature relative value of all the temperature measurement points is greater than a first preset threshold, increasing rotating speed of the fans in the fan subset by one level according to current rotating speed of the fans, the increased rotating speed not exceeding a maximum fan rotating speed; when the maximum temperature relative value of all the temperature measurement points is lower than a second preset threshold, decreasing the rotating speed of the fans in the fan subset by one level according to the current rotating speed of the fans, the decreased rotating speed being not lower than a minimum fan rotating speed; and when the maximum temperature relative value of all the temperature measurement points is between the second threshold and the first threshold, keeping the rotating speed of the fans in the fan subset unchanged.

Herein, a rotating speed detection signal of each fan in the fan set is assigned with a number different from others, and the number of each rotating speed detection signal is consistent with a number of each rotating speed detection slot in a fan control board. A control signal of each fan in the fan set is assigned with a number different from others, and the number of each control signal is consistent with the number of each control slot in the fan control board.

In the embodiment of the disclosure, the fans in the fan set are arranged in a matrix manner and the control slots for control lines of the fans and the rotating speed detection slots for rotating speed detection lines are separately installed. The control slots of the fans in the same row are installed together and the rotating speed detection slots of the fans in the same column are installed together. Thus, a position of each fan in the fan set is determined according to a matrix scanning detection method.

Preferably, determining the position of each fan in the fan set according to the matrix scanning detection method includes the following steps: for a detected fan, applying a control signal different from those of the other fans to its control slot to make the rotating speed of the fan different from those of the other fans; detecting all the rotating speed detection signals one by one to find a unique rotating speed detection signal to which the rotating speed different from the other rotating speeds corresponds, and recording the number of the unique rotating speed detection signal; and determining the position of the detected fan according to the number of the control slot to which the control signal is applied and the number of the unique rotating speed detection signal.

Certain gaps are kept between the fan subsets and the heat dissipation air channels, so that the heat dissipation fans of each fan subset supply a small amount of air to the adjacent heat dissipation air channels.

Figure 3:
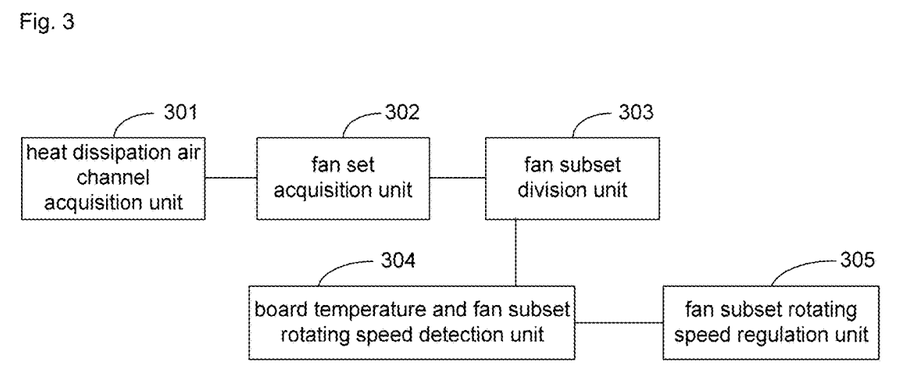
FIG. 3 is a diagram of an apparatus for controlling subrack fans according to an embodiment of the disclosure.

FIG. 3 is a diagram of an apparatus for controlling subrack fans according to an embodiment of the disclosure. As shown in FIG. 3, the apparatus includes: a heat dissipation air channel acquisition unit 301, configured to form multiple heat dissipation air channels respectively corresponding to multiple boards by installing the multiple boards with high-power devices in different areas of a subrack; a fan set acquisition unit 302, configured to install a fan set including multiple heat dissipation fans on the subrack; a fan subset division unit 303, configured to divide the fan set into multiple fan subsets corresponding to the multiple heat dissipation air channels respectively so as to supply air to the corresponding board by each of the multiple fan subsets through the corresponding heat dissipation air channel; a board temperature and fan subset rotating speed detection unit 304, configured to detect temperature of each board and a rotating speed of the corresponding fan subset in real time; and a fan subset rotating speed regulation unit 305, configured to regulate the rotating speeds of the fan subsets according to detection results in a manner that the rotating speed of any of the fan subsets is increased or decreased with increase or decrease of the temperature of the corresponding board.

In the embodiment of the disclosure, the board temperature and fan subset rotating speed detection unit 304 includes a board temperature detection module and a rotating speed acquisition module (both are not shown in FIG. 3), wherein the board temperature detection module is configured to: measure temperatures of temperature measurement points on each board via temperature sensors respectively; calculate a temperature relative value at each of temperature measurement points according to the temperature at each of temperature measurement points and pre-stored reference temperature at each of temperature measurement points; and compare the temperature relative values of all temperature measurement points to obtain a maximum temperature relative value of all the temperature measurement points.

In the embodiment of the disclosure, the fan subset rotating speed regulation unit 305 is configured to: when the maximum relative value of the temperature of the temperature measurement point is greater than a first preset threshold, increase a rotating speed of the fans in the fan subset by one level according to a current rotating speed of the fans, the increased rotating speeds not exceeding a maximum fan rotating speed; when the maximum temperature relative value of all the temperature measurement points is lower than a second preset threshold, decrease the rotating speed of the fans in the fan subset by one level according to the current rotating speed of the fans, the decreased rotating speed being not lower than a minimum fan rotating speed; and when the maximum temperature relative value of all the temperature measurement points is between the second threshold and the first threshold, keep the rotating speed of the fans in the fan subset unchanged.

In practice, all of the heat dissipation air channel acquisition unit 301, the fan set acquisition unit 302, the fan subset division unit 303, the board temperature and fan subset rotating speed detection unit 304 and the fan subset rotating speed regulation unit 305 may be implemented as a Central Processing Unit (CPU), or a Digital Signal Processor (DSP), or a Field Programmable Gate Array (FPGA) or the like. All of the CPU, the DSP and the FPGA may be built in a communication equipment such as a base station.

Figure 4:
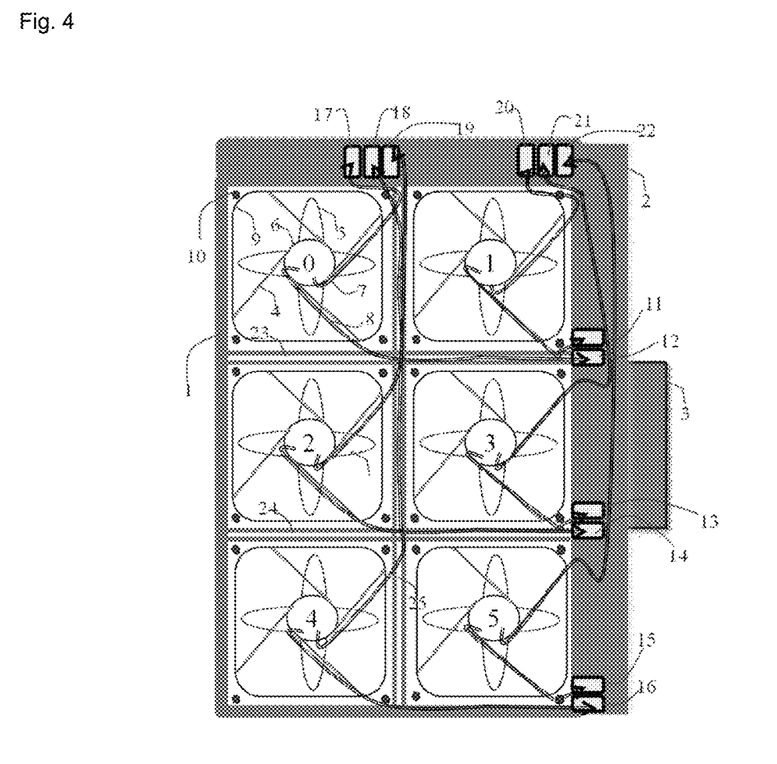
FIG. 4 is an overall assembly diagram of a fan set according to an embodiment of the disclosure.

FIG. 4 is an overall assembly diagram of a fan set according to an embodiment of the disclosure. In FIG. 4, 1—overall metal bracket for fans; 2—fan control board; 3—strip for connecting the fan control board with the backboard of the subrack; 4—bracket for fixing individual fans; 5—fan blade; 6—rotating shaft of the fan; 7—fan rotating speed detection line; 8—fan rotating speed control line; 9—frame of individual fans; 10—screw for fixing individual fans on the overall metal bracket 1; 11—slot 0 for the fan rotating speed control line in the fan control board; 12—slot 1 for the fan rotating speed control line in the fan control board; 13—slot 2 for the fan rotating speed control line in the fan control board; 14—slot 3 for the fan rotating speed control line in the fan control board; 15—slot 4 for the fan rotating speed control line in the fan control board; 16—slot 5 for the fan rotating speed control line in the fan control board; 17—slot 0 for the fan rotating speed detection line in the fan control board; 18—slot 1 for the fan rotating speed detection line in the fan control board; 19—slot 2 for the fan rotating speed detection line in the fan control board; 20—slot 3 for the fan rotating speed detection line in the fan control board; 21—slot 4 for the fan rotating speed detection line in the fan control board; 22—slot 5 for the fan rotating speed detection line in the fan control board; 23—control line wiring channel for Fans 0 and 1; 24—control line wiring channel for Fans 2 and 3; and 25—detection line wiring channel for Fans 0, 2 and 4.

Herein, multiple heat dissipation fans are assembled on the same bracket, and physically form a set of fans.

The multiple fans may be divided into multiple subsets according to corresponding relationships between the fans and heat dissipation air channels, and the subsets respectively dissipate heat in the different air channels.

The fan set is not seamlessly connected with the heat dissipation air channels, and certain gaps (the sizes of the gaps are determined according to characteristics and heat dissipation requirements of the subrack) are kept between the fan set and the heat dissipation air channels. Most air provided by the fans in each subset is blown into the corresponding air channel, and a small amount of air is blown to the adjacent air channels.

Control lines and rotating speed detection lines of the fans are separated. Control line slots of the fans in the same row are provided together, and rotating speed detection line slots of the fans in the same column are provided together.

FIG. 4 is described below in detail.

The multiple fans mentioned in the abovementioned solution are shown as fans 0, 1, 2, 3, 4 and 5 in FIG. 4. The frame 9 of each fan is fixed on the bracket 1 through the screws 10. The rotating shaft 6 of each fan is connected to the frame 9 of the fan via the plastic 4.

The fan set may be divided into three subsets based on a matrix arrangement. Fans 0 and 1 form subset 0 corresponding to row 0 of a matrix, and mainly cool slots 0 and 1 of the subrack in FIG. 1. Fans 2 and 3 form subset 1 corresponding to row 1 of the matrix, and mainly cool slots 2 and 3 of the subrack in FIG. 1. Fans 4 and 5 form subset 2 corresponding to row 2 of the matrix, and mainly cool slots 4 and 5 of the subrack in FIG. 1.

The control lines and rotating speed detection lines of the fans are separated.

For fan 0, the control line 8 is inserted into slot 1 for control 12 through control line wiring channel 23 for fans 0 and 1, and may also be inserted into slot 0 for control 11. The control lines of fans 0 and 1 must be inserted into slot 0 for rotating speed control 11 and slot 1 for rotating speed control 12, respectively, but their positions are interchangeable. In order to ensure assembly reliability, slot 0 for rotating speed control 11 and slot 1 for rotating speed control 12 are separately formed in positions close to fan 1. Similarly, the rotating speed control lines of fans 2 and 3 are inserted into slot 2 for rotating speed control 13 and slot 3 for rotating speed control 14, and slot 2 for rotating speed control 13 and slot 3 for rotating speed control 14 are separately formed in positions close to fan 3. The control lines of fans 4 and 5 are inserted into slot 4 for rotating speed control 15 and slot 5 for rotating speed control 16, and slot 4 for rotating speed control 15 and slot 5 for rotating speed control 16 are separately formed in positions close to fan 5.

For fan 0, the rotating speed detection line 7 is inserted into slot 0 for rotating speed detection 17 through rotating speed detection line wiring channel 25 for fans 0, 2 and 4, and may also be inserted into slot 1 for rotating speed detection 18 and slot 2 for rotating speed detection 19. The rotating speed detection line for fan 2 is inserted into slot 1 for rotating speed detection 18 through rotating speed detection line wiring channel 25 for fans 0, 2 and 4. The rotating speed detection line for fan 4 is inserted into slot 2 for rotating speed detection 9 through rotating speed detection line wiring channel 25 for fans 0, 2 and 4. The rotating speed detection lines for fans 0, 2 and 4 are inserted into slot 0 for rotating speed detection 17, slot 1 for rotating speed detection 18 and slot 2 for rotating speed detection 19 in a changeable position. In order to ensure assembly reliability, slot 0 for rotating speed detection 17, slot 1 for rotating speed detection 18 and slot 2 for rotating speed detection 19 are formed close to fan 0 in a transverse wiring board. Similarly, the rotating speed detection lines of fans 1, 3 and 5 are inserted into slot 3 for rotating speed detection 20, slot 4 for rotating speed detection 21 and slot 5 for rotating speed detection 22 in a changeable position. In order to ensure assembly reliability, slot 3 for rotating speed detection 20, slot 4 for rotating speed detection 21 and slot 5 for rotating speed detection 22 are formed close to fan 1 in the transverse wiring board.

In such a manner, slot 0 for rotating speed control 11 and slot 1 for rotating speed control 12 may be considered as row 0 of the matrix; slot 2 for rotating speed control 13 and slot 3 for rotating speed control 14 may be considered as row 1 of the matrix; and slot 4 for rotating speed control 15 and slot 5 for rotating speed control 16 may be considered as row 2 of the matrix. Slot 0 for rotating speed detection 17, slot 1 for rotating speed detection 18 and slot 2 for rotating speed detection 19 may be considered as column 0 of the matrix, and slot 3 for rotating speed detection 20, slot 4 for rotating speed detection 21 and slot 5 for rotating speed detection 22 may be considered as column 1 of the matrix.

Numbers of control signals are consistent with numbers of the control slots respectively. In order to differentially control the fans, it is necessary to accurately determine the control slot number corresponding to each fan. Numbers of rotating speed detection signals are consistent with numbers of the rotating speed detection slots respectively. In order to accurately display the rotating speed of each fan, it is necessary to accurately determine the rotating speed detection slot number corresponding to each fan.

Under the condition that the corresponding relationships between the numbers are unknown for software, it is necessary to determine the corresponding relationships by detection. A detection method includes applying a rotating speed different from those of the other fans to a detected control slot, finding the number consistent with the current rotating speed from the rotating speed detection signals, accurately determining the fan through the row and column where the control slot number and the rotating speed detection slot number are located and performing the above one by one to determine the control slot numbers and rotating speed detection slot numbers corresponding to all the fans.

Figure 5:
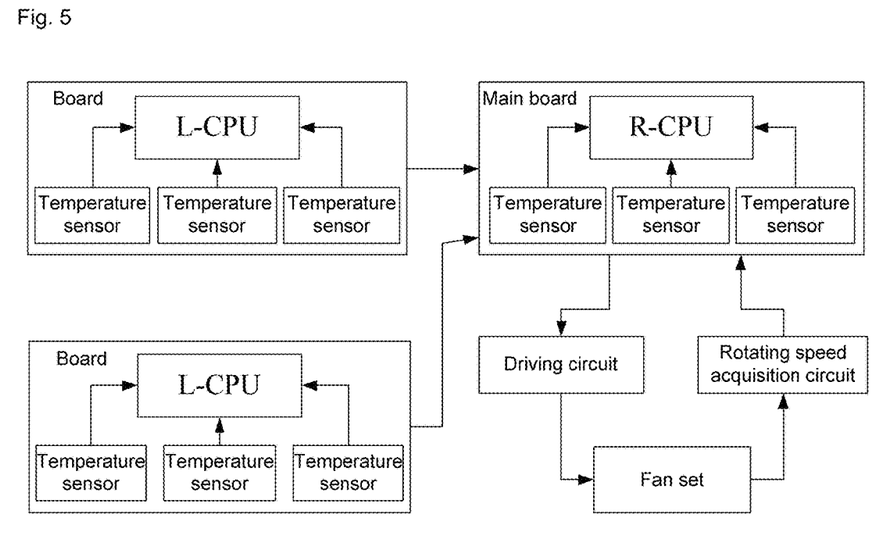
FIG. 5 is an overall diagram of temperature acquisition and fan control according to an embodiment of the disclosure.

A detection idea is described below with reference to FIG. 5 to FIG. 7 in detail.

If all the fans work normally, each fan may be differentially controlled according to temperature of each slot to effectively reduce the power consumption and noise of the fans while ensuring heat dissipation of the system.

According to characteristics of the fan set and the software, the process for controlling fans may be divided into the following three stages: a software starting stage, a fan detection stage and a software control stage.

In the software starting stage, a software system does not enter a working state yet. The fans rotate according to a default rotating speed set by a hardware register at this time. In the stage, the rotating speed of the fans may be set to be 75% of a full speed, so that the heat dissipation in the system can be ensured, and the noise of the fans and impulse current during power-on can be taken into account.

The fan detection stage and the software control stage are implemented after the software system works normally. When the software system just works normally or the fans are plugged and unplugged after the software system works normally, the software system has not yet accurately determined the control line slot number and rotating speed detection line slot number of each fan, and the process enters the fan detection stage.

Variables are defined as follows: fanmaxspeed-representing a maximum rotating speed of the fans; fanprobespeed-representing rotating speed required to be set for detected fan; fanneedsetspeed-representing rotating speed required to be set for the other fans except the detected fan; fanmaxerrorrange-representing a maximum reasonable range of errors between detection rotating speed and control rotating speed; fanchangerange-representing a once-changed rotating speed value during rotating speed regulation, which is required to be more than twice fanmaxerrorrange in order to ensure detection reliability; fancontrolline-representing the control line slot numbers corresponding to the fans; fancollectline-representing the rotating speed detection line slot numbers; fanline-representing the row numbers of the fans in the fan set in the matrix, which may also be understood as subset numbers for the speed regulation of the fans; fanrank-representing the column numbers of the fans in the fan set in the matrix; and fansubnum-representing the number of the fans in each row.

In the fan detection stage, the speed will be regulated as a whole for the non-detected fans. As shown in FIG. 5, a method for overall speed regulation according to temperature information of each temperature measurement point is introduced below.

Step A: a Line card-Central Processing Unit (L-CPU) of each board accesses all local temperature sensors every 30 s through an Inter-Integrated Circuit (IIC) bus, acquires temperature information of temperature-sensitive areas, and reports current temperature and reference temperature of each temperature measurement point to a Router Processing-Central Processing Unit (R-CPU) of the main board in a control plane communication manner. The R-CPU stores the information, and meanwhile, the R-CPU of the main board also acquires the temperature information of the temperature-sensitive areas of the main board every 30 s.

The temperature sensors may be located at some positions, which are most sensitive to temperature, in the system, for example, in the vicinity of a CPU chip. These temperature sensors may be arranged on purpose, and may also be temperature sensors built-in the chips.

Figure 6:
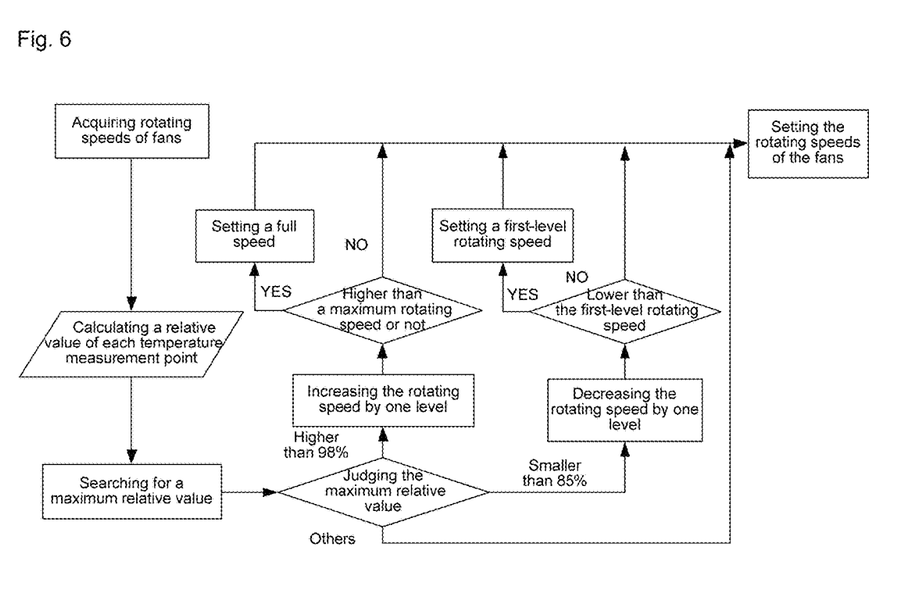
FIG. 6 is a flowchart of a fan speed regulation software according to an embodiment of the disclosure.

Step B: as shown in FIG. 6, current rotating speeds of all the fans in the fan set are acquired. The master control R-CPU calculates a temperature relative value K (which is a proportion of the temperature of the temperature measurement point to the reference temperature of the same temperature measurement point) of each temperature measurement point, searches for a maximum relative value, and regulates the speed of the whole fan set according to the maximum relative value. If the maximum temperature relative value K is higher than 98%, the rotating speed of the fans is increased by one level (the rotating speeds is increased by one fanchangerange), and the increased rotating speed does not exceed the maximum rotating speed. If the maximum temperature relative value K is lower than 85%, the rotating speed of the fans is decreased by one level (the rotating speeds is decreased by one fanchangerange), and the decreased rotating speed is not lower than one fanchangerange; and under other conditions, the rotating speed is kept unchanged.

For convenient description, a flow of the software in the fan detection stage is introduced by way of a fan set structure in FIG. 4.

The row numbers of the fans in the fan set in the form of matrix in FIG. 4 may be understood as the subset numbers when controlling the fans based on the different subsets. Fans 0 and 1 are in row 0, i.e. subset 0; fans 2 and 3 are in row 1, i.e. subset 1; and fans 4 and 5 are in row 2, i.e. subset 2.

In the matrix of the fans in the fan set in FIG. 4, fans 0, 2 and 4 are in the same column numbered as 0 in the fan matrix, and correspond to detection slots 0, 1 and 2; and fans 1, 3 and 5 are in the same column numbered as 1 in the fan matrix, and correspond to detection slots 3, 4 and 5.

In the fan detection stage, the overall speed regulation is used for the fans except the detected fan.

Step C: a rotating speed to be set for the non-detected fans is generated according to the method in Step B, wherein a minimum value of the rotating speed to be set for the non-detected fans is 75% of a maximum rotating speed.

Figure 7:
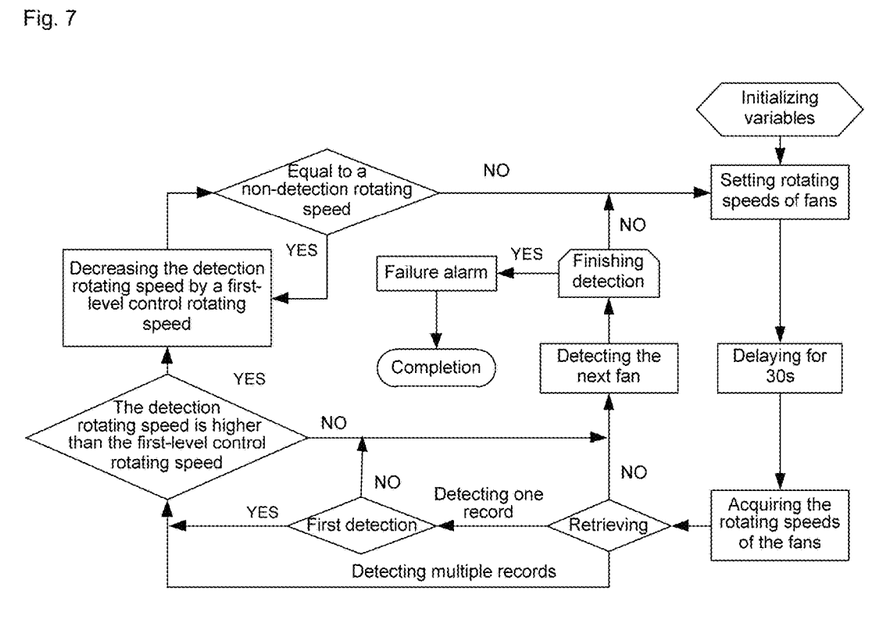
FIG. 7 is a flowchart of a fan detection software according to an embodiment of the disclosure.

FIG. 7 is a flowchart of the software in the fan detection stage, and detection is polled based on the control slot numbers, from control slot 0 as the beginning, i.e. fancontrolline=0.

Step D: the variables are initialized to start detection, detection rotating speed fanprobespeed is set to be 50% of the full speed, the control slot number and the detection slot number corresponding to each fan are initialized to be invalid values 0×ff, and the other variables are cleared.

Step E: the rotating speeds of the fans are set, wherein the rotating speeds of the fans are set to be rotating speed required to be set for the non-detected fans, which is generated in Step C, and the detection rotating speed of the detected fan, respectively.

Step F: the rotating speeds of the fans are acquired, wherein the rotating speed of each fan is acquired after 30 s from the latest setting.

Step G: the rotating speeds are detected, wherein Step G1 is executed if it is the first detection for a certain fan control slot, and Step G2 is executed if it is not the first detection.

Step G1: the acquired rotating speed of each fan is compared with the detection rotating speed, and the fan detection slot numbers with their rotating speeds falling in the fanmaxerrorrange of the detection rotating speed are recorded. If there are fans meeting the requirements, the detection rotating speed fanprobespeed is decreased by one fanchangerange, and Step E is executed. If there are not fans meeting the requirements, it is indicated that no fans are detected, and Step G5 is executed.

Step G2: the acquired rotating speeds corresponding to the fan detection slot numbers recorded in Step G1 are compared with the detection rotating speed respectively, and if the rotating speed of some fan is beyond the fanmaxerrorrange of the detection rotating speed, the corresponding fan detection slot number is deleted from the records. Detection results are rechecked, and if there are no records, it is indicated that no fans are detected, and Step G5 is executed. If there is one record, Step G4 is executed. If there are still multiple records, Step G3 is executed.

Step G3: if fanprobespeed is greater than fanchangerange, the detection rotating speed fanprobespeed is decreased by one fanchangerange, and Step E is executed, and if fanprobespeed is less than or equal to fanchangerange, Step G5 is executed.

Step G4: the corresponding column number fanrank of the fan set is 0 if the detection line numbers are 0, 1 and 2, and the corresponding column number fanrank of the fan set is 1 if the detection slot numbers are 3, 4 and 5. The number fanline*fansubnum+fanrank of the fan which is successfully detected at present can be obtained according to the row and column numbers of the matrix of the fan set, the detected control slot number and detection slot number are included in the corresponding fan structure body, and Step G5 is executed.

Step G5: if all the fans are detected, Step H is executed; and if the fans are not completely detected, the detection rotating speed fanprobespeed is set to be 50% of the full speed, fancontroline is increased by 1, the next fan control slot is detected, and Step C is executed.

Step H: all the fans are detected, the detection results are checked, and if there are fans which are not detected, it is indicated that the fans fail, change of the rotating speeds cannot be fulfilled by regulation, a failure alarm is given, and a user is prompted to replace the fans.

By the abovementioned matrix scanning, the user can be accurately prompted of the numbers of the fans with failure when there is an alarm.

After the fans are detected, the software control stage is started.

A certain gap is formed in the joints between the fan set and the air channels. Air of the fans in one subset mainly flows into the corresponding air channel, and a small part of air may flow into the adjacent air channels. Thus, it is necessary to perform overall speed regulation to enable the fan subset working normally to assist in the heat dissipation of the fan subset working abnormally in case that there is a fan with failure. If there are fans with failure in Step H, the fans are controlled in the manner in Step B to perform overall speed regulation after the software control stage is started.

If all the fans are detected, the speed regulation of the fan set is performed based on different subsets. The temperatures of the temperature measurement points are acquired in the manner in Step A, and the regulation flow enters Step I.

Figure 1:
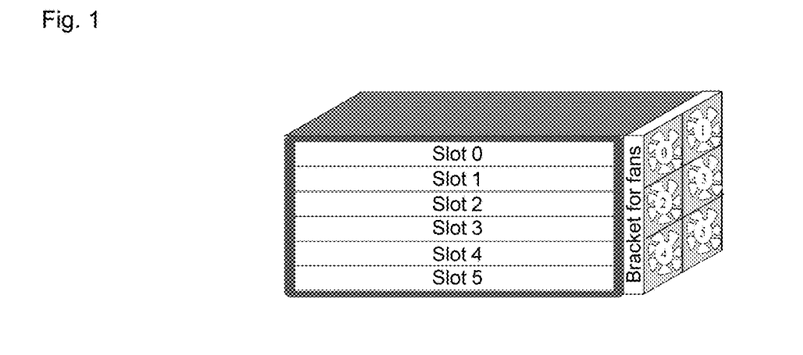
FIG. 1 is diagram of an overall structure of a type of subracks according to an embodiment of the disclosure.

Step I: for sake of convenient description, FIG. 1 is taken as an example, which is an overall structure diagram of a type of subracks. A board is fixed at each slot, and electronic chips such as a CPU, an FPGA and a network processor are arranged on each board. Independent heat dissipation air channels are formed. The left and right sides of the subrack are ventilated. Airflow is blown into the right side of the subrack via a heat dissipation fan set, and heat is carried out from the left side through the six independent heat dissipation air channels and heat dissipation fins of heating devices so as to achieve heat dissipation. There are six heat dissipation fans fixed on a fan bracket to form a set of fans, and the overall assembly diagram is shown in FIG. 4. By such a structure, the fans can be conveniently replaced. During installation and dismantlement, it is only necessary to insert or extract the whole fan bracket into or from the fan slot in order to install and replace. According to the corresponding relationships between the fans and the slots, fans 0 and 1 mainly cool air channels 0 and 1, fans 2 and 3 mainly cool air channels 2 and 3, and fans 4 and 5 mainly cool air channels 4 and 5.

The flowchart of the software is shown in FIG. 6. The current rotating speeds of all the fans of the fan set are acquired, and the master control R-CPU calculates the temperature relative value K (which is a proportion of the temperature of the temperature measurement point to the reference temperature of the temperature measurement point) of each temperature measurement point.

The maximum temperature relative value is searched from all the temperature measurement points at slots 0 and 1, and the speed of fans 0 and 1 is regulated according to the maximum relative value. If the maximum temperature relative value is higher than 98%, the rotating speed of fans 0 and 1 is increased by one level (the rotating speed is increased by one fanchangerange), and the increased rotating speed does not exceed the maximum rotating speed. If the maximum temperature relative value K is lower than 85%, the rotating speed of fans 0 and 1 is decreased by one level (the rotating speed is decreased by one fanchangerange), and the decreased rotating speed is not lower than one fanchangerange. Under other conditions, the rotating speed of fans 0 and 1 is kept unchanged.

The maximum temperature relative value is searched from all the temperature measurement points at slots 2 and 3, and the speed of fans 2 and 3 is regulated according to the maximum relative value. If the maximum temperature relative value is higher than 98%, the rotating speed of fans 2 and 3 is increased by one level (the rotating speed is increased by one fanchangerange), and the increased rotating speed does not exceed the maximum rotating speed. If the maximum temperature relative value K is lower than 85%, the rotating speed of fans 2 and 3 is decreased by one level (the rotating speed is decreased by one fanchangerange), and the decreased rotating speed is not lower than one fanchangerange. Under other conditions, the rotating speed of fans 2 and 3 is kept unchanged.

The maximum temperature relative value is searched from all the temperature measurement points at slots 4 and 5, and the speed of fans 4 and 5 is regulated according to the maximum relative value. If the maximum temperature relative value is higher than 98%, the rotating speed of fans 4 and 5 is increased by one level (the rotating speed is increased by one fanchangerange), and the increased rotating speed does not exceed the maximum rotating speed. If the maximum temperature relative value K is lower than 85%, the rotating speed of fans 4 and 5 is decreased by one level (the rotating speed is decreased by one fanchangerange), and the decreased rotating speed is not lower than one fanchangerange. Under other conditions, the rotating speed of fans 4 and 5 is kept unchanged.

There are different methods for setting the temperature measurement points with reference values, and boundary values for temperature relative values are also different during rotating speed regulation, specifically with reference to heat test results.

According to the embodiments of the disclosure, the rotating speeds of the fans are acquired once every 30 s. The rotating speeds of the fans are reset according to Step I after being acquired. In order to ensure the balance of rotating speeds, the rotating speed differences between individual subsets may also be set to be below a certain range. After each subset is independently set, certain values are added to low rotating speeds to ensure that the rotating speed differences between the subsets are below a certain range.

According to the method and apparatus for controlling fans of a type of subracks in the embodiments of the disclosure, this type of the subracks is provided with multiple heat dissipation air channels, the fans in the fan set are divided into different subsets according to the heat dissipation air channels, and each subset cools one or more heat dissipation air channels. The fans in the fan set are arranged in a format of matrix. Control line slot and rotating speed detection line slot of each fan are separated. A control line slot number and a rotating speed detection line slot number of each fan are accurately determined by matrix scanning. By the method and apparatus provided by the embodiments of the disclosure, the power consumption and noise of the fans can be effectively reduced while ensuring heat dissipation of the system. The rotating speed of each fan is also accurately displayed.

From the above, the embodiments of the disclosure have such benefits as the power consumption and noise of the fans are effectively reduced while ensuring heat dissipation of the system, and the rotating speed of each fan is accurately displayed by designing an apparatus including a set of fans, a fan detection method and a fan control method according to the different subsets.

Although the disclosure is described above in detail, the disclosure is not limited to the above. Those skilled in the art may make various modifications according to the principle of the disclosure. Therefore, modifications made according to the principle of the disclosure shall fall within the scope of protection of the disclosure.

What is claimed is:

1. A method for controlling subrack fans, comprising:
   forming multiple heat dissipation air channels respectively corresponding to multiple boards by installing the multiple boards with high-power devices in different areas of a subrack;
   installing a fan set comprising multiple heat dissipation fans on the subrack;
   dividing the fan set into multiple fan subsets corresponding to the multiple heat dissipation air channels respectively so as to supply air to the corresponding board by each of the multiple fan subsets through the corresponding heat dissipation air channel;
   detecting temperature of each board and a rotating speed of the corresponding fan subset in real time;
   regulating the rotating speeds of the fan subsets according to detection results to enable the rotating speed of any of the fan subsets to be increased or decreased with increase or decrease of the temperature of the corresponding board;
   further comprising:
   assigning rotating speed detection signal of each fan in the fan set with a number, and making the number of each rotating speed detection signal consistent with a number of each rotating speed detection slot in a fan control board;
   assigning control signal of each fan in the fan set with a number, and making the number of each control signal consistent with the number of each control slot in the fan control board;
   arranging the fans of the fan set in a format of matrix;
   separately installing the control slots for the control lines of the fans and the rotating speed detection slots for the rotating speed detection lines of the fans, wherein the control slots of the fans in the same row are formed together and the rotating speed detection slots of the fans in the same column are formed together; and
   determining a position of each fan in the fan set by a matrix scanning detection method.

2. The method according to claim 1, wherein the step of detecting the temperature of each board in real time comprises:
   measuring temperatures at temperature measurement points on each board via temperature sensors respectively;
   calculating a temperature relative value at each temperature measurement point according to the temperature at each temperature measurement point and pre-stored reference temperature at each temperature measurement point; and
   comparing the temperature relative values at all temperature measurement points to obtain a maximum temperature relative value of all the temperature measurement points.

3. The method according to claim 2, wherein the step of regulating the rotating speeds of the fan subsets according to the detection results comprises:
   when the maximum temperature relative value of all the temperature measurement points is greater than a first preset threshold, increasing rotating speed of the fans in the fan subset by one level according to current rotating speed of the fans, the increased rotating speed not exceeding a preset maximum fan rotating speed;
   when the maximum temperature relative value of all the temperature measurement points is lower than a second preset threshold, decreasing the rotating speed of the fans in the fan subset by one level according to the current rotating speed of the fans, the decreased rotating speed being not lower than a preset minimum fan rotating speed; and
   when the maximum temperature relative value of all the temperature measurement points is between the second threshold and the first threshold, keeping the rotating speed of the fans in the fan subset unchanged.

4. The method according to claim 1, wherein the step of determining the position of each fan in the fan set by the matrix scanning detection method comprises:
   for a detected fan, applying a control signal different from those of the other fans to the control slot of the detected fan to make the rotating speed of the detected fan different from those of the other fans;
   detecting all the rotating speed detection signals one by one to find a unique rotating speed detection signal to which the rotating speed different from the other rotating speeds corresponds, and recording the number of the unique rotating speed detection signal; and
   determining the position of the detected fan according to the number of the control slot to which the control signal is applied and the number of the unique rotating speed detection signal.

5. The method according to claim 1, wherein certain gaps are kept between the fan subsets and the heat dissipation air channels, so that the heat dissipation fans of each fan subset supply a small amount of air to the adjacent heat dissipation air channels.

6. An apparatus for controlling subrack fans, comprising:
   a processor; and
   a memory for storing instructions executed by the processor;
   wherein the processor is arranged to:

form multiple heat dissipation air channels respectively corresponding to multiple boards by installing the multiple boards with high-power devices in different areas of a subrack;

install a fan set comprising multiple heat dissipation fans on the subrack;

divide the fan set into multiple fan subsets corresponding to the multiple heat dissipation air channels respectively so as to supply air to the corresponding board by each of the multiple fan subsets through the corresponding heat dissipation air channel;

detect temperature of each board and a rotating speed of the corresponding fan subset in real time; and regulate the rotating speeds of the fan subsets according to detection results to enable the rotating speed of any of the fan subsets to be increased or decreased with increase or decrease of the temperature of the corresponding board;

wherein the processor is further arranged to:

assign rotating speed detection signal of each fan in the fan set with a number, and make the number of each rotating speed detection signal consistent with a number of each rotating speed detection slot in a fan control board; and assign control signal of each fan in the fan set with a number, and make the number of each control signal consistent with the number of each control slot in the fan control board;

arrange the fans of the fan set in a format of matrix;

separately instal the control slots for the control lines of the fans and the rotating speed detection slots for the rotating speed detection lines of the fans, wherein the control slots of the fans in the same row are formed together and the rotating speed detection slots of the fans in the same column are formed together; and determine a position of each fan in the fan set by a matrix scanning detection method.

7. The apparatus according to claim 6, wherein the processor is further arranged to:

measure temperatures at temperature measurement points on each board via temperature sensors respectively;

calculate a temperature relative value at each temperature measurement point according to the temperature at each temperature measurement point and pre-stored reference temperature at each temperature measurement point; and compare the temperature relative values at all temperature measurement points to obtain a maximum temperature relative value of all the temperature measurement points.

8. The apparatus according to claim 6, wherein the processor is further arranged to:

when the maximum temperature relative value of all the temperature measurement points is greater than a first preset threshold, increase a rotating speed of the fans in the fan subset by one level according to a current rotating speed of the fans, the increased rotating speed not exceeding a preset maximum fan rotating speed;

when the maximum temperature relative value of all the temperature measurement points is lower than a second preset threshold, decrease the rotating speed of the fans in the fan subsets by one level according to the current rotating speed of the fans, the decreased rotating speed being not lower than a preset minimum fan rotating speed; and when the maximum temperature relative value of all the temperature measurement points is between the second threshold and the first threshold, keep the rotating speed of the fans in the fan subset unchanged.

* * * * *